United States Patent
De Sá Martins

(10) Patent No.: US 12,384,937 B2
(45) Date of Patent: Aug. 12, 2025

(54) COMPOSITION FOR COATING SUBSTRATES, METHODS AND USES THEREOF

(71) Applicant: Chemitek—Química Avançada, S.A, Esposende (PT)

(72) Inventor: César André De Sá Martins, Aldreu (PT)

(73) Assignee: CHEMITEK—QUÍMICA AVANÇADA, S.A., Esposende (PT)

( * ) Notice: Subject to any disclaimer, the term of this patent is extended or adjusted under 35 U.S.C. 154(b) by 240 days.

(21) Appl. No.: 17/617,997

(22) PCT Filed: Jun. 23, 2020

(86) PCT No.: PCT/IB2020/055931
§ 371 (c)(1),
(2) Date: Dec. 10, 2021

(87) PCT Pub. No.: WO2020/261121
PCT Pub. Date: Dec. 30, 2020

(65) Prior Publication Data
US 2022/0251417 A1    Aug. 11, 2022

(30) Foreign Application Priority Data
Jun. 26, 2019    (PT) .................................... 115599

(51) Int. Cl.
*C09D 183/08*    (2006.01)
*C03C 17/30*    (2006.01)
(Continued)

(52) U.S. Cl.
CPC ............ *C09D 183/08* (2013.01); *C03C 17/30* (2013.01); *C09D 4/00* (2013.01); *C09D 5/00* (2013.01);
(Continued)

(58) Field of Classification Search
CPC .. C09D 183/04; C09D 183/08; C09D 183/16; C09D 7/20; C09D 7/45; C09D 7/63;
(Continued)

(56) References Cited

U.S. PATENT DOCUMENTS

| | | |
|---|---|---|
| 5,310,720 A | 5/1994 | Shin et al. |
| 5,328,768 A | 7/1994 | Goodwin |

(Continued)

FOREIGN PATENT DOCUMENTS

| | | | |
|---|---|---|---|
| CN | 102888037 A | * | 1/2013 |
| CN | 107722283 A | | 2/2018 |

(Continued)

OTHER PUBLICATIONS

Toxicology Regulatory Services, Inc., "Alkyldimethulbenzylammonium Chloride (ADBAC) Category High Production Volume (HPV) Chemicals Challenge Final Test Status and Data Review", Mar. 1, 2011, pp. 1-25 (Year: 2011).*

(Continued)

*Primary Examiner* — Mayla Gonzalez Ramos
(74) *Attorney, Agent, or Firm* — Leason Ellis LLP

(57) ABSTRACT

The present description refers to new coatings for substrates. In particular, the application of coatings in substrates of glass, acrylic, metal or combinations thereof, in particular for increasing the yield of solar panels/solar cells. Application methods and uses thereof are also described in the present disclosure.

11 Claims, 2 Drawing Sheets

(51) Int. Cl.

| | | |
|---|---|---|
| *C09D 4/00* | (2006.01) | |
| *C09D 5/00* | (2006.01) | |
| *C09D 7/20* | (2018.01) | |
| *C09D 7/45* | (2018.01) | |
| *C09D 7/63* | (2018.01) | |
| *C09D 7/65* | (2018.01) | |
| *C09D 133/14* | (2006.01) | |
| *C09D 183/16* | (2006.01) | |
| *H10F 19/80* | (2025.01) | |

(52) U.S. Cl.
CPC ............... *C09D 7/20* (2018.01); *C09D 7/45* (2018.01); *C09D 7/63* (2018.01); *C09D 7/65* (2018.01); *C09D 133/14* (2013.01); *C09D 183/16* (2013.01); *H10F 19/804* (2025.01); *C03C 2217/76* (2013.01); *C03C 2217/78* (2013.01)

(58) Field of Classification Search
CPC ... C09D 7/65; C09D 4/00; C09D 5/00; C09D 133/14; C03C 17/30; C03C 2217/00; C03C 2217/76; C03C 2217/78
See application file for complete search history.

(56) References Cited

U.S. PATENT DOCUMENTS

| | | |
|---|---|---|
| 6,153,304 A | 11/2000 | Smith et al. |
| 2013/0053493 A1 | 2/2013 | Nakano et al. |
| 2017/0313833 A1* | 11/2017 | Shimazaki ............ C09D 183/06 |

FOREIGN PATENT DOCUMENTS

| | | | | |
|---|---|---|---|---|
| DE | 19950383 A1 | | 4/2001 | |
| EP | 2613362 A1 | | 7/2013 | |
| JP | H05263037 A | | 10/1993 | |
| JP | 2000144042 A | | 5/2000 | |
| JP | 2005302706 A | * | 10/2005 | ........... G03F 7/0047 |
| JP | 2006261189 A | * | 9/2006 | |
| JP | 2006291012 A | * | 10/2006 | |
| JP | 2010251434 A | | 11/2010 | |
| JP | 2015137362 A | | 7/2015 | |
| JP | 2019014790 A | | 1/2019 | |
| JP | 2019014793 A | | 1/2019 | |
| WO | 2012018160 A1 | | 2/2012 | |
| WO | 2013022511 A1 | | 2/2013 | |
| WO | 2015088808 A1 | | 6/2015 | |

OTHER PUBLICATIONS

Machine translation of CN-102888037-A, Gu Jianping. (Year: 2013).*
Machine translation of JP-2006261189-A, Nishiyama K. (Year: 2006).*
Machine translation of JP 2005302706 A, Kosaka et al. (Year: 2005).*
Machine translation of JP-2006291012-A, Tanaka Yoko. (Year: 2006).*
Muhammed J. Adinoyi et al., "Effect of dust accumulation on the power outputs of solar photovoltaic modules", Renewable Energy, Dec. 2013, pp. 633-636, vol. 60.

* cited by examiner

COMPOSITION FOR COATING SUBSTRATES, METHODS AND USES THEREOF

CROSS-REFERENCE TO RELATED APPLICATIONS

This application is a U.S. National Stage Application under 35 U.S.C. § 371 of International Patent Application No. PCT/IB2020/055931, filed Jun. 23, 2020, which claims priority to Portugal Patent Application No. 115599, filed Jun. 26, 2019, the contents of which are each hereby incorporated by reference in their respective entireties.

TECHNICAL FIELD

The present description refers to new coatings for substrates, in particular the application of coatings in substrates of glass, acrylic, metal or combinations thereof, in particular panels, preferably solar cells or panels, application methods and uses thereof.

BACKGROUND

Over time and depending on the environment, the glass of solar panels becomes dirty, leading to a reduction in energy production. The panels require maintenance, mainly regular washing to remove the accumulated dirt.

As solar panels are placed in the horizontal or with little inclination relative to the ground, they easily accumulate dirt, rain water, animals, among others, which causes a decrease in the use of solar energy and, consequently, a loss of efficiency in energy production. As noted, at the end of six months, the solar panels lose about 50% of efficiency due to dirt and particles that accumulate (Adinoyi M J, Said SAM. Effect of dust accumulation on the power outputs of solar photovoltaic modules, Elsevier J Renew Energy 2013:633-6).

To overcome this problem there are already in the prior art some solar panel coatings in order to increase the efficiency of this renewable energy source. However, the existing coatings are not very effective, in the sense that they allow the accumulation of dirt on the panels and/or require frequent washing in order to keep the panels functional.

Titanium oxide, both hydrophobic and hydrophilic, is commonly found in solar panel coatings of the prior art, which makes self-cleaning extremely slow. Titanium oxide, $TiO_2$, due to its reactivity degrades the organic compounds, mas it cannot degrade and remove the inorganic deposits, which constitute most of the dirt in solar park panels and in desert areas, such as dust, sand, among others. Thus, the effect of the existence of $TiO_2$ on the panels' coating is practically null.

Hence the need to develop a product that washes and at the same time deposits a protective film so that the dirt does not adhere so easily.

U.S. Pat. No. 5,310,720A describes a process for fabricating an integrated circuit device by forming a planarized polysilazane layer and oxidizing to form an oxide layer—it describes a thick planarization layer of silicon dioxide that is resistant to the heat provided by coating a layer of polysilazane onto a substrate by firing the polysilazane layer in an oxygen-containing atmosphere for converting the polysilazane into silicon dioxide. The disclosed temperature of conversion is from 400° C. to 450° C., however a higher firing or curing temperature is preferred with the aim of obtaining a more densified oxide layer.

CN107722283A describes an ultra-hard organosilicon hydrophobic glass resin, refers to anti-fouling glasses made of super-rigid resin and its manufacturing method, in particular super-rigid, super-lubricated, waterproof, anti-fog and anti-stain glasses and its manufacturing method. The main technical characteristics of this resin are the ability to overcome the drawbacks of the low abrasion resistance, easily absorbing water and oil pollution, and obtaining a super-rigid film, the super-rigid film is produced by adding 5%-13% titanium particles to the hardening solution, in addition, ion-aided hard coating techniques are used in the production of multi-layer anti-reflective films, which are covered with high-performance nanometric films, and the multi-layer anti-reflective films have compressibility and sliding properties.

U.S. Pat. No. 5,328,768A describes a method and device in which a glass substrate is provided with a more durable non-wetting surface by treatment with a perfluoroalkylalkylsilane and a fluorinated olefin telomer on a surface comprising a layer of silica primer.

U.S. Pat. No. 6,153,304 describes a hydrophobic coating system for application to an inorganic, organic or metallic substrate, namely articles of manufacture provided with a low energy surface, permanently anti-sticking, anti-fouling and ice-phobic surface by a coating system comprising the application of a primary coating having a surface energy of 22-28 dyn/cm$^2$ comprising a new polymeric material having anti-sticking and hardness properties and then applying a top coating having a lower surface energy of about 18-21 dyn/cm$^2$ comprising a silicone polymer and interdigitating means for making the top coating permanent, preferably comprising a double coating or polyfunctional organic compound adapted to wet the surface of the primary coating, bind it chemically or physically and coupling it to the silicon polymeric substance in the top coating. Coated substrates are resistant to graffiti marking and to the adhesion by marine fouling organisms, and frozen ice on the surface is easily removed.

One of the aims of the present disclosure is to provide a composition of solar panel coating that prevents the accumulation of dirt on the surface of the panels, thus increasing the efficacy of solar energy use.

Another aim of the present invention is to provide a composition that ensures the efficacy of solar panels for at least 12 months and which can go up to several years, with minimal maintenance, thus reducing the costs related with washing and maintenance.

Another aim of the invention is to provide a biodegradable, anti-static composition and that reduces the environmental impact caused by the maintenance of solar panels, particularly with regard to waste of water.

These facts are described in order to illustrate the technical problem addressed by the present invention.

GENERAL DESCRIPTION

In one embodiment, the present invention discloses a coating composition for increasing the yield of a substrate, preferably a solar panel or a solar cell; more preferably in a vitreous substrate; that comprises:
  0.1 to 50% (w/w) of an active compound selected from the following list: tetraethoxysilane, organosilane, a magnesium salt, polyethylene glycol, polyethylene wax, polyethylene, ethylene-vinyl acetate, silicone, or mixtures thereof;
  8 to 99% (w/v) of a solvent selected from the following list: water, $C_2$-$C_{10}$ alcohol, butyl acetate, 1-methoxy- 2-propyl acetate, 2-butoxyethyl acetate, 2-(2-butoxyethoxy)ethyl acetate, dipropylene glycol dimethyl ether, diethylene glycol dibutyl ether, or mixtures thereof;
wherein the silicone is selected from the following list: poly[3-((2-aminoethyl)amino)propyl]methyl(dimethyl)siloxane, amino-modified polydimethylsiloxane, aminopropylaminoethylpolysiloxane, alkyl amino-functional polysiloxane, amino-functional polysiloxane, tetraethoxysilane or mixtures thereof; and optionally plasticizers.

In one embodiment, the composition described in the present disclosure comprises:
0.1 to 50% (w/w) of an active compound;
40 to 99% (w/v) of a solvent.

In one embodiment, the butyl acetate is n-butyl acetate or t-butyl acetate.

In another embodiment, the invention discloses a composition that comprises:
1 to 50% (w/w) of an active compound;
40 to 99% (w/v) of a solvent.

In another embodiment, the invention discloses a composition that comprises:
5 to 40% (w/w) of an active compound;
60 to 90% (w/v) of a solvent.

In another embodiment, the invention discloses a composition that comprises:
30% (w/v) of alcohol;
0.2% (w/v) of preservative;
10% (w/v) of aminopropylaminoethylpolysiloxane;
optionally other components or mixtures thereof;
and water up to 100% (w/v).

In another embodiment, the invention discloses a composition that comprises:
30 to 40% (w/v) of ethanol;
50% (w/v) of water;
10% (w/v) of amino-modified polydimethylsiloxane; or
10% (w/v) of alkyl amino-functional polysiloxane.

In another embodiment, the invention discloses a composition wherein the $C_2$-$C_{10}$ alcohol is ethanol, propanol or mixtures thereof.

In another embodiment, the invention discloses a composition wherein the active compound is a magnesium salt, polyethylene wax, polyethylene, ethylene-vinyl acetate, silicone, or mixtures thereof.

In another embodiment, the invention discloses a composition wherein the active ingredient is a mixture of polyethylene wax, ethylene-vinyl acetate and silicone.

In another embodiment, the invention discloses a composition that further comprises:
1 to 60% (w/v) of a surfactant; preferably a non-ionic, cationic, anionic surfactant, or mixtures thereof; preferably from 1 to 54% (w/v).

In another embodiment, the invention discloses a composition that comprises:
1 to 30% (w/v) of a non-ionic surfactant, preferably from 5 to 30% (w/v), more preferably from 1 to 5% (w/v);
1 to 24% (w/v) of a cationic surfactant, preferably from 4 to 24% (w/v), more preferably from 1 to 5% (w/v).

In another embodiment, the invention discloses a composition that further comprises from 0.1 to 30% (w/v) of plasticizer, preferably from 1 to 30% (w/v) of plasticizer, more preferably from 1 to 5% (w/v) of plasticizer.

In one embodiment, the plasticizer is polyethylene wax.

In another embodiment, the invention discloses a composition wherein the non-ionic surfactant comprises an ethoxylated alcohol, preferably ethoxylated $C_{10}$ alcohol.

In another embodiment, the invention discloses a composition wherein the cationic surfactant comprises quaternary $C_{12}$-$C_{14}$ alkyl methyl amine ethoxylate methyl chloride.

In another embodiment, the invention discloses a composition that comprises at least two of the following compounds:
1 to 30% (w/v) of a non-ionic surfactant that comprises an ethoxylated $C_9$-$C_{11}$ alcohol, preferably ethoxylated $C_{10}$ alcohol; and
1 to 24% (w/v) of a cationic surfactant: quaternary $C_{12}$-$C_{14}$ alkyl methyl amine ethoxylate methyl chloride;
1 to 30% (w/v) of a magnesium salt, polyethylene wax, polyethylene, ethylene-vinyl acetate, polyethylene glycol, silicone, tetraethoxysilane, or mixtures thereof.

In another embodiment, the invention discloses a composition that comprises all the following compounds:
1 to 30% (w/v) of a non-ionic surfactant that comprises an ethoxylated $C_9$-$C_{11}$ alcohol, preferably ethoxylated $C_{10}$ alcohol; and
1 to 24% (w/v) of a cationic surfactant that comprises a quaternary $C_{12}$-$C_{14}$ alkyl methyl amine ethoxylate methyl chloride;
1 to 30% (w/v) of a magnesium salt, polyethylene wax, polyethylene, ethylene-vinyl acetate, polyethylene glycol, silicone, tetraethoxysilane, or mixtures thereof.

In another embodiment, the invention discloses a composition wherein the magnesium salt is magnesium fluoride, magnesium fluorosilicate, or mixtures thereof.

In another embodiment, the invention discloses a composition wherein the active ingredient is a mixture of a magnesium salt, polyethylene wax, polyethylene, ethylene-vinyl acetate, polyethylene glycol and silicone.

In another embodiment, the invention discloses a composition that further comprises from 1 to 20% (w/v) of tetraethoxysilane.

In another embodiment, the invention discloses a composition wherein the substrate is glass, metal, acrylic or combinations thereof.

In one embodiment, the invention discloses a composition wherein the substrate is vitreous, preferably glass.

In one embodiment, the invention discloses a coating composition to increase the yield of a solar panel or a solar cell that consists of:
0.1 to 50% (w/w) of polysilazane;
40 to 99% (w/v) of a solvent selected from the following list: n-butyl acetate, t-butyl acetate, 1-methoxy-2-propyl acetate, 2-butoxyethyl acetate, 2-(2-butoxyethoxy) ethyl acetate, or mixtures thereof.

In a further embodiment, the invention discloses the use of the coating composition of the present invention as a dirt-repellent agent, and as hydrostatic and hydrophobic agent.

In one embodiment, the present disclosure describes the use of the coating composition of the present invention as a yield enhancer of a solar panel or a solar cell.

In further embodiments, the invention describes articles that comprise the coating composition of the present invention.

In another embodiment, the invention discloses an article of glass, metal, acrylic or combinations thereof, onto which the compositions of the present invention are deposited.

In another embodiment, the invention discloses an article that is a solar cell or a solar panel, onto which the compositions of the present invention are deposited.

BRIEF DESCRIPTION OF THE DRAWINGS

For an easier understanding, figures are herein attached which represent preferred embodiments that are not intended to limit the object of the present description.

DETAILED DESCRIPTION

Figure 1:
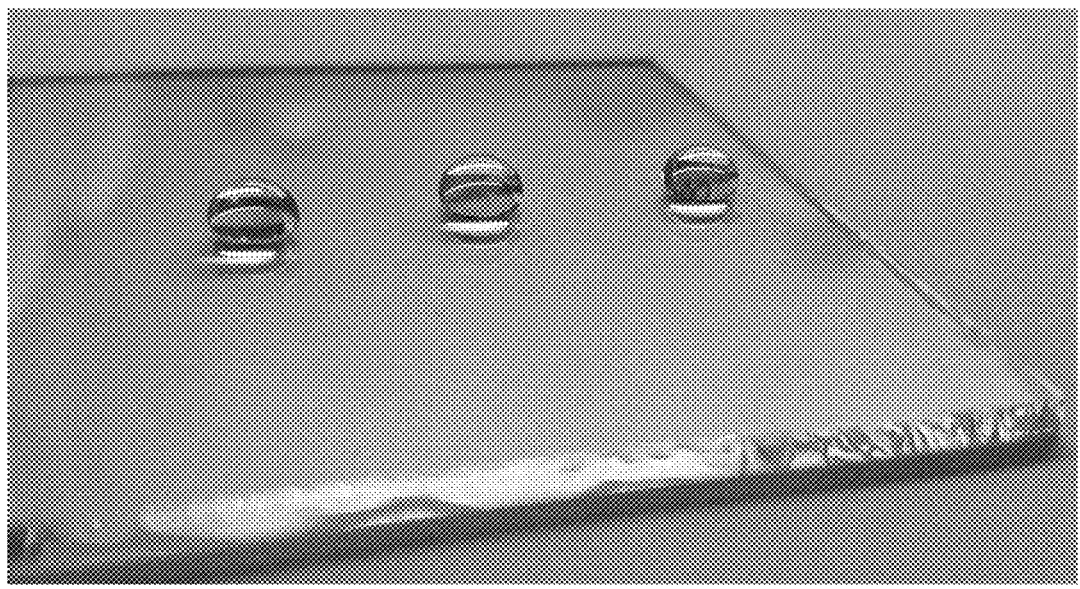
FIG. 1—Glass with the sample coating 4.
Figure 2:
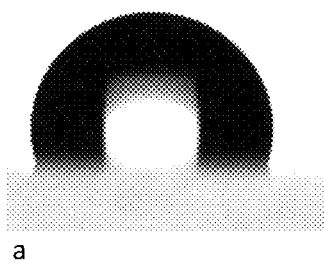
FIG. 2a)—Glass with drop of water; 2b) glass with drop of diomethane.
Figure 2:
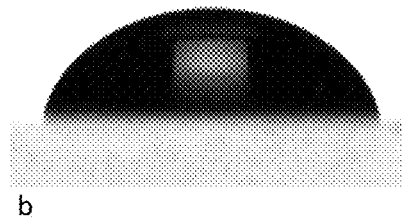

The present description refers to new coatings for substrates. In particular, the application of the coatings in glass, acrylic, metal substrates or combinations thereof, in particular for increasing the yield of solar panels/solar cells. Application methods and uses thereof are also described in the present disclosure.

The present disclosure describes a coating composition for a substrate, preferably a vitreous substrate, that comprises from 0.1 to 50% (w/w) of tetraethoxysilane, organosilane, a magnesium salt, polyethylene glycol, polyethylene, polyethylene wax, ethylene-vinyl acetate, silicone, or mixtures thereof, from 40 to 99% (w/v) of a solvent and optionally plasticizers.

The present disclosure is particularly described using preferred embodiments. Therefore, the disclosure is not limited only to the descriptions and illustrations provided. These are used so that the disclosure is sufficiently detailed and comprehensive. Furthermore, the intention of the drawings is for illustrative purposes and not for limiting purposes.

The present disclosure comprises solutions for coating of substrates, in particular of glass, with anti-dirt (anti-soiling) properties, preferably for increasing the yield of solar panels and/or cells, or for use in glass for windows or other applications.

In one embodiment, the coatings of the present disclosure clean and protect the surfaces against dirt, making them anti-adherent, dirt-repellent, surprisingly increasing the yield of the solar panels. Other surfaces such as metals can also be protected with this type of coating, protecting them from scratches and oxidation.

In one embodiment, the films of the present invention represent a layer of the coating applied on the glass surface.

In one embodiment, there is the need for the panels to leave the factory with the coating of the present invention already applied, in order to avoid the constant need for washing, as can be seen by the application of the coatings of examples 4 to 14.

In one embodiment, the solutions are coatings for surfaces such as glass (any type), acrylics, metals and all kind of materials.

In one embodiment, the methodology of the present description comprises the following mixture: surfactants (non-ionic, anionic or cationic), solvents, chelating agents, polymers, silanes, ortho-silicates, particles, organosilanes and combinations thereof.

In one embodiment, the application of the solutions on surfaces ranges between 1 ml and 500 ml per m$^2$, being done by spray, dipping or other.

In one embodiment, the methodology of the present description comprises the following list of solvents: water, n-propanol, ethanol, n-butyl acetate, t-butyl acetate, 1-methoxy-2-propyl acetate (MPA), 2-butoxyethyl acetate (BGA), 2-(2-butoxyethoxy)ethyl acetate (BDGA), dipropylene glycol dimethyl ether, diethylene glycol dibutyl ether.

In one embodiment, the active ingredients can be: polymers, such as: polyethylene glycol, polyethylene wax, polyethylene, ethylene-vinyl acetate, silicone, vinyl; particles, such as: magnesium fluorosilicate, silica, magnesium; silanes, such as: amino-modified polydimethylsiloxane, hydroxy-terminated poly[3-((2-aminoethyl)amino)propyl]methyl(dimethyl)siloxane, 3-aminopropyltrimethoxysilane, aminopropylaminoethylpolysiloxane, amino-modified 3-[(2-aminoethyl)amino]propylpolydimethylsiloxane, 3-aminopropylmethyldiethoxysilane, 3-aminopropyltriethoxysilane, vinyltrimethoxysilane, orthosilicates, tetraethoxysilane; plasticizers, such as: polyether modified polysiloxane, thermoplastic acrylic resin, cellulose acetate butyrate.

In one embodiment, the chelating agents can be the following: HEDP (etidronic acid), ATMP (aminotris(methylenephosphonic acid)), DTPMP (diethylenetriaminopenta (methylenephosphonic) acid), HDTMP (hexadiaminotetra (methylenephosphonic) acid), HEMPA (hydroxyethylamino-di(methylenephosphonic) acid), PBTC (2-phosphonobutane-1,2,4-tricarboxylic acid), BHMTMP (bis(hexamethylene)triamine-pentakis(methylphosphonic) acid), EDTA (ethylenediaminetetraacetic acid), MGDA (methylglycinediacetic acid trisodium salt), NTA (nitrilotriacetic acid), or mixtures thereof.

In one embodiment, the composition described in the present disclosure can further comprise surfactant agents selected from the following list:

Non-ionic surfactants, such as: 7 mol of ethylene oxide ethoxylated fatty alcohol (hereinafter "EO"), ethoxylated $C_9$-$C_{11}$ alcohol, ethoxylated $C_{10}$ alcohol, ethoxylated $C_9$-$C_{11}$ alcohol, ethoxylated $C_9$-$C_{11}$ alcohol (4 EO), ethoxylated $C_9$-$C_{11}$ alcohol (6 EO), ethoxylated $C_9$-$C_{11}$ alcohol (8 EO), ethoxylated $C_9$-$C_{11}$ alcohol <2.5 EO, ethoxylated $C_{16}$-$C_{18}$ alcohol, propoxylated ethoxylated $C_{12}$-$C_{14}$ alcohol, ethoxylated $C_{12}$-$C_{14}$ alcohol (1-2.5 EO), ethoxylated $C_{12}$-$C_{14}$ alcohol (1-6 EO), ethoxylated $C_{12}$-$C_{14}$ alcohol, ethoxylated $C_{12}$-$C_{14}$ alcohol (5-15 EO), ethoxylated $C_{16}$-$C_{18}$ alcohol, ethoxylated $C_6$-$C_{12}$ alcohol, branched ethoxylated $C_{11}$-$C_{13}$ alcohol, ethoxylated $C_9$-$C_{11}$ alcohol, ethoxylated alkylamide, ethoxylated alkylamine 2EO, ethoxylated alkylamine, propylamine, unsaturated $C_{12}$-$C_{18}$ and $C_{18}$ amides, N-(hydroxyethyl)ethoxylated, ethoxylated coconut oil alkyl amine, ethoxylated tallow alkyl amines (>5 OE), ethoxylated tallow alkyl amines (1-4.5 EO), ethoxylated tallow alkyl amines (10-15 EO), ethoxylated N-tallow alkyltrimethylenediamines, propoxylated ethoxylated tallow alkyl amines, propoxylated and ethoxylated ethylenediamine (1-8.5 EO), ethoxylated glycerine, ethoxylated acrylic acid esters of ethoxylated oleylamine lanolin (30 moles EO).

Anionic surfactants: dodecyloxypoly(ethyleneoxy)ethyl sulfate, sodium salt of acidilsulfonic, $C_{14}$-$C_{16}$ hydroxyalkane and $C_{14}$-$C_{16}$ hydroxyalkene, sulfonic acid (LABSA), alkyl polyglucosides, disodium lauryl sulfosuccinate, sodium lauryl sarcosinate, sodium lauryl sulfate, sodium 2-ethylhexyl sulfate, sodium cocoyl glutamate.

Cationic surfactants, such as: $C_{12}$-$C_{14}$ quaternary methyl chloride, ethoxylated alkylmethylamine, $C_{10}$-$C_{20}$ and $C_{16}$-$C_{18}$ fatty acids, ethoxylated quaternary coco amine, ethoxylated $C_{12}$-$C_{14}$ quaternary alkylmethylamine, methyl chloride; quaternary ammonium compounds: ethoxylated (2-amino-2-oxoethyl)bis(hydroxyethyl)tallow alkyl, chlorides, quaternary amine compounds, ($C_{16}$-$C_{18}$ and $C_{18}$-unsaturated, alkyl)trimethyl quaternary amine compounds, alkyldimethylbenzyl $C_{12}$-$C_{16}$ chlorides, benzyl-alkyl-$C_{10}$-$C_{16}$, benzyl-$C_{10}$-$C_{16}$-alkylsulfate, benzyl-$C_{12}$-$C_{18}$, alkyldimethyl, thiocyanates, benzyl-$C_{14}$-$C_{18}$-alkyldimethyl, quaternary amine compounds, bis(hydrogenated tallow alkyl) dimethyl, alkylethyldimethyl, ethyl sulfates, alkyltrimethyl $C_{16}$-$C_{18}$, $C_{20}$-$C_{22}$-alkyltrimethyl, coco (hydroxyethyl)methyl alkylbis, coco alkyltrimethyl, methyl sulfates.

In one embodiment, the methodology of the present description further comprises the following list of preservative reagents: benzalkonium chloride, didecyldimethylammonium chloride, methylisothiazolinone, isothiazolinone.

EXAMPLES

The followings examples intend to illustrate some of the embodiments of the present invention, yet not being limitative.

All of the following examples were carried out by deposition of the compositions described in the present disclosure onto glass.

The parameter analysed was the angle formed by water and diomethane when in contact with the glass surface of a solar panel. This parameter is used because through this method and this technique it is possible to measure the hydrophobic effect of the coating through its angle of contact, thus obtaining an angle repellence value.

The application of the coatings of the present invention on other substrates is also part of the scope of application of the invention, namely on metal due to the formulation of the finished product. The application of the coating on metal prevents oxidation and patina formation on metals. Patina is a chemical substance which is formed naturally by exposure of metals to the elements and climate.

Within the scope of the present invention and in different embodiments, the following samples have been produced:

Sample 1: In one embodiment, add 89.8% (w/v) of water, then add 0.2% (w/v) of preservative and stir. To the previous solution under stirring add 1% (w/v) of DTPMP—subsequently 5% (w/v) of ethoxylated $C_9$-$C_{11}$ alcohol, ethoxylated $C_{10}$ alcohol and then 4% (w/v) of quaternary $C_{12}$-$C_{14}$ alkyl methyl amine ethoxylate methyl chloride. Stirring for 20 minutes.

Sample 2: In one embodiment, add 85.8% (w/v) of water, then add 0.2% (w/v) of preservative and stir. To the previous solution under stirring add 1% (w/v) of DTPMP, subsequently 5% (w/v) of ethoxylated $C_9$-$C_{11}$ alcohol, ethoxylated $C_{10}$ alcohol and then 4% (w/v) of quaternary $C_{12}$-$C_{14}$ alkyl methyl amine ethoxylate methyl chloride. Finally, add 3% (w/v) of polyethylene wax and 1% (w/v) of tetraethoxysilane, under continuous stirring. Stirring for 20 minutes.

Sample 3: In one embodiment, add 85.8% (w/v) of water/alcohol, then add 0.2% (w/v) of preservative and stir. To the previous solution under stirring add 1% (w/v) of DTPMP, subsequently 5% (w/v) of ethoxylated $C_9$-$C_{11}$ alcohol, ethoxylated $C_{10}$ alcohol and then 4% (w/v) of quaternary $C_{12}$-$C_{14}$ alkyl methyl amine ethoxylate methyl chloride. Finally, add 5% (w/v) of polyethylene wax under continuous stirring. Stirring for 20 minutes.

Sample 4: In one embodiment, add 98.5% (w/v) of N-propanol, then add 1.5% (w/v) of amino-modified polydimethylsiloxane or tetraethoxysilane.

Sample 5: In one embodiment, add 93.5% (w/v) of N-propanol, then add 1.5% (w/v) of tetraethoxysilane, 2% (w/v) of magnesium fluorosilicate, 3% (w/v) of polyethylene glycol under continuous stirring. Stirring for 20 minutes.

Sample 6: In one embodiment, add 89.8% (w/v) of water or alcohol, then add 0.2% (w/v) of preservative and stir. To the previous solution under stirring add 10% (w/v) of amino-modified polydimethylsiloxane under continuous stirring. Adjust the pH to 4.0 to 5.5. Stirring for 20 minutes.

Sample 7: In one embodiment, add 79% (w/v) of n-butyl acetate, then add 20% (w/v) of polysilazanes and 1% of 3-[(2-aminoethyl)amino]propyl, amino-modified polydimethylsiloxane, with continuous stirring. Stirring for 10 minutes.

Sample 8: In one embodiment, add 60% (w/v) of n-butyl acetate, then add 40% (w/v) of polysilazanes under continuous stirring. Stirring for 10 minutes.

Sample 9: In one embodiment, add 40% (w/v) of n-butyl acetate and 20% (w/v) of N-propanol then add 40% (w/v) of polysilazanes under continuous stirring. Stirring for 10 minutes. It was found that, after being applied onto a glass sample, the product did not polymerise uniformly on the sample. It should also be noted that polysilazanes react with alcohols, such as N-propanol, releasing hydrogen and ammonia.

Sample 10: In one embodiment, add 98% (w/v) of N-propanol or ethanol, then add 2% (w/v) of epoxi functional group: (3-glycidoxypropyltrimethoxysilane or 3-aminopropyltriethoxysilane).

Sample 11: In one embodiment, add 98% (w/v) of N-propanol or ethanol, then add acrylate functional group: 2% (w/v) of 3-(Trimethoxysilyl)propyl methacrylate.

Sample 12: In one embodiment, add 74.8% (w/v) of water or alcohol, then add 0.2% (w/v) of preservative and stir. To the previous solution under stirring add 1% (w/v) of DTPMP, subsequently 5% of ethoxylated $C_9$-$C_{11}$ alcohol, ethoxylated $C_{10}$ alcohol and then 4% (w/v) of quaternary $C_{12}$-$C_{14}$ alkyl methyl amine ethoxylate methyl chloride. Add 2% (w/v) of magnesium fluorosilicate, 3% (w/v) of polyethylene wax under continuous stirring. Finally, add 10% (w/v) of alkyl amino-functional polysiloxane or amino-modified polydimethylsiloxane. Stirring for 20 minutes.

Sample 13: In one embodiment, add 68% (w/v) of butyl glycol and 30% (w/v) of water or alcohol. To the previous solution under stirring add 2% (w/v) of amino-functional polysiloxane under continuous stirring. Adjust the pH to 4.0 to 5.5. Stirring for 20 minutes.

Sample 14: In one embodiment, add 30-40% (w/v) of ethanol and 50% (w/v) of water, then add 10% (w/v) of amino-modified polydimethylsiloxane or 10% (w/v) of alkyl amino-functional polysiloxane under continuous stirring. Adjust the pH to 4.0 to 5.5. Stirring for 20 minutes.

Sample 15: In one embodiment, sample 3 can be prepared in concentrated form for further dilution. Add 9.6% (w/v) of solvent, preferably water or ethanol, then add 0.4% (w/v) of preservative and stir. To the previous solution under stirring add 6% (w/v) of DTPMP, subsequently 30% (w/v) of ethoxylated $C_9$-$C_{11}$ alcohol, ethoxylated $C_{10}$ alcohol and then 24% (w/v) of quaternary $C_{12}$-$C_{14}$ alkyl methyl amine ethoxylate methyl chloride. Add also 30% (w/v) of polyethylene wax under continuous stirring. The sample thus prepared can be stored and subsequently diluted at the time of use thereof.

In one embodiment some tests were applied with the aim to assess if the substrate coating compositions of the present invention are effectively hydrophobic, resistant to ultraviolet rays (UV) exposure, resistant to temperature and resistant to friction caused by sand.

Figure 3:
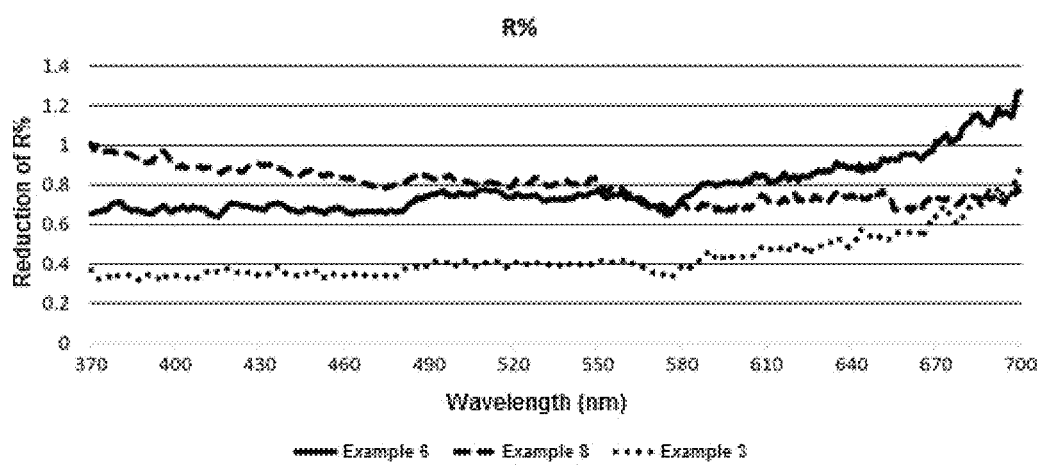
FIG. 3—Analysis of the reflectance capacity of specific samples.

In one embodiment, FIG. 3 shows that the use of the compositions of the present disclosure in the substrates to which they are applied causes a decrease in the reflectance in all spectra (Sample 1-15). The table below shows the reflectance decrease average of each of said samples in relation to glass:

TABLE 1

| Decrease average in relation to glass | | |
|---|---|---|
| Sample 6 | Sample 8 | Sample 3 |
| 0.748% | 0.817% | 0.409% |

Test 1—Hydrophobicity

The aim of this test is to measure the hydrophobicity level of the glass surface, being considered acceptable a value higher than 70.

In this test a surface tension analysis was performed, using the contact angle measurement methodology. This measurement evaluates the contact intensity between liquid and solid substances in coatings. The relation between the contact angle (°), the solid surface free energy ($\gamma_{SA}$), the interfacial tension between liquid and solid ($\gamma_{LS}$) and the liquid surface free energy ($\gamma_{LA}$), define the Young's equation ($\gamma_{SA}=\gamma_{SL}+\cos °$). The total surface energy ($\gamma$) can be obtained as the sum of a dispersion component ($\gamma_d$) and a polar component ($\gamma_p$). The interfacial energy ($\gamma_{SL}$) between a liquid and a substrate can be evaluated as follows:

$$\gamma_{SL}=\gamma_{SA}+\gamma_{LA}-2\sqrt{\gamma_S^d\gamma_L^d}-2\sqrt{\gamma_S^p\gamma_L^p}$$

Wherein $\gamma_d$ is the dispersive component and $\gamma_p$ is the polar component. By combining the above equation with the results of Young's equation, results in:

$$(1+\cos\theta_0)\gamma_{LA}=2\sqrt{\gamma_S^d\gamma_L^d}-\sqrt{\gamma_S^p\gamma_L^p}$$

Thus, in Table 2 the values of the angles measured with water and diomethane in each of the samples of the present invention are shown.

TABLE 2

Hydrophobicity indicators of the glass surface by measuring the angle of contact of glass with water and the angle of contact of glass with diomethane, and washing power.

| Sample | Angle with water (°) | Angle with diomethane (°) | Washing power |
|---|---|---|---|
| Glass | 42 | 45 | — |
| Glass with Sample 1 | 42 | 45 | yes |
| Glass with Sample 2 | 51 | 53 | Yes |
| Glass with Sample 4 | 107 | 96 | no |
| Glass with Sample 6 | 93 | 71 | no |
| Glass with Sample 8 | 93 | 69 | no |
| Glass with Sample 9 | 62 | 57 | no |
| Glass with Sample 10 | 48 | 47 | no |
| Glass with Sample 11 | 46 | 43 | no |
| Glass with Sample 12 | 86 | 68 | yes |
| Glass with Sample 13 | 92 | 70 | no |
| Glass with Sample 14 | 95 | 73 | no |

When analysing table 2, "washing power" means the ability to wash the glass through the presence or absence of surfactants.

Although sample 4 exhibits a better hydrophobicity value, samples 6 and 8 exhibit a higher solution stability in the long term, as can be seen in the tests of the present invention.

Test 2—Resistance to UV Exposure

The aim of this test is to measure the level of resistance of the glass surface to UV exposure, being considered acceptable a value higher than 70.

The methodology used was the direct exposure of the glass surface of a solar panel, with and without the invention coatings. The conditions used were as follows:
UV lamp: UVA 340 nm
Irradiation: 0.76 W/m²
Temperature: 60° C.

This test was based on ISO 4892-3 (2016) Standard. The results obtained are shown in Table 3 below.

TABLE 3

UV exposure resistance indicators by measuring the contact angle of samples subjected to 100 hours, 200 hours and 300 hours of UVA light exposure.

| UV exposure | Glass | Glass with Sample 3 | Glass with Sample 4 | Glass with Sample 6 | Glass with Sample 8 |
|---|---|---|---|---|---|
| Angle with water (°) | | | | | |
| 0 h | 42 | 51 | 107 | 93 | 93 |
| 100 h | — | 25 | 90 | 98 | 97 |
| 200 h | — | 59 | 64 | 70 | 93 |
| 300 h | — | 23 | 52 | 86 | 92 |
| Angle with diomethane (°) | | | | | |
| 0 h | 45 | 53 | 96 | 71 | 69 |
| 100 h | — | 52 | 84 | 74 | 67 |
| 200 h | — | 56 | 69 | 69 | 69 |
| 300 h | — | 53 | 66 | 70 | 68 |

Through this test we were able to simulate if the films undergo any degradation in contact with UV light, having as degradation factor the decrease of the contact angle. By analysing the table, it is concluded that sample 4 was the only sample that showed some considerable value change, thus showing that with UV exposure there is some degradation.

Test 3—Resistance to Temperature

The aim of this test is to measure the level of temperature resistance of the glass surface, being considered acceptable a value higher than 70.

The samples were subjected to 50 thermal cycles under the following conditions:
Temperature ramp=−40° C. to 85° C.
Humidity=0%.

TABLE 4

Temperature Resistance Indicators by measuring the contact angle of the samples.

| | Glass | Glass with Sample 3 | Glass with Sample 4 | Glass with Sample 6 | Glass with Sample 8 |
|---|---|---|---|---|---|
| Angle with water (°) | | | | | |
| Start | 43 | 51 | 107 | 93 | 93 |
| Total of cycles: 50 | — | 55 | 110 | 104 | 94 |
| Angle with diomethane (°) | | | | | |
| Start | 45 | 53 | 96 | 71 | 69 |
| Total of cycles: 50 | — | 52 | 94 | 74 | 67 |

Through this test we were able to simulate if the films undergo any degradation with temperature cycles, having as degradation factor the decrease of the contact angle. By analysing the table none of the samples show degradation with thermal cycles.

Test 4—Resistance to Sand Friction

The aim of this test is to simulate the sand friction on the surface of the film, by simulating a sandstorm, being considered acceptable a value higher than 70.

The following conditions were used in this test:
Stirring speed=300 rpm
Time=3 min
Abrasive material=white corundum 40 μm diameter
Room temperature

TABLE 5

Contact angle of samples subjected to the sand test.

|  | Glass | Glass with Sample 3 | Glass with Sample 4 | Glass with Sample 6 | Glass with Sample 8 |
|---|---|---|---|---|---|
| Angle with water (°) | | | | | |
| Start | 43 | 51 | 107 | 93 | 93 |
| End | 55 | 66 | 111 | 103 | 95 |
| Angle with diomethane (°) | | | | | |
| Start | 45 | 53 | 96 | 71 | 69 |
| End | 50 | 45 | 88 | 70 | 64 |

The sand test is performed to simulate the friction that sand causes when panels are installed in desert areas, where natural phenomena such as sandstorms are frequent. In this way, it is possible to analyse the resistance of films to friction caused by sand.

Through this test it is possible to verify if the films undergo any degradation with friction of sand on their surface, having as an indicator of degradation the decrease of the contact angle. By analysing the results shown in the table, none of the samples show a significant degradation in the presence of sand friction.

Test 5—Assessment of Compatibility Between Sample 3 and the Materials

The aim of this test was to analyse the effect of sample 3 on the materials that compose solar panels. For this purpose, two different materials, such as glass and plastic, were selected for the experimental test.

In a first experiment, the materials were immersed in a solution of sample 3 (concentrated, undiluted) for eight days (192 h) and a scanning electron microscopy (SEM) analysis with dispersive energy X-ray spectroscopy (EDX/EDS) was performed. Silicon dioxide ($SiO_2$) and polymethacrylate (PMMA) were independently deposited on two different plates.

Silicon dioxide and polymethacrylate were used to mimic the glass and the polymer respectively, which are in the composition of a solar panel. To test the effect of sample 3 on the different materials composing a solar panel, the materials of the washing product were immersed for eight days (192 h).

The characterisation of the materials was based on the measurement of their thickness, before and after submersion in sample 3 solution. The thickness of the layers was measured using an optical profilometer.

The thickness of $SiO_2$ and PMMA layers tested remained constant after the materials were submerged in sample 3 solution for eight days. It can be concluded that sample 3 does not interfere with the thickness of $SiO_2$ and PMMA materials during the time period of the tests.

Even using concentrated sample 3, without dilution and emerging the materials after 8 days there was no influence on the materials.

It is therefore concluded that the use of sample 3 in the cleaning of solar panels will not cause any degradation effect or deterioration of the panel materials.

The present invention is of course in no way limited to the embodiments described in this document and a person of ordinary skill in the art may foresee many possibilities to modify it and substitute technical characteristics by equivalent characteristics, depending on the requirements of each situation, as defined in the attached claims.

The followings claims further define preferred embodiments.

The invention claimed is:

1. A dirt-repellent coating composition for increasing the yield of a solar panel, comprising:
   1 to 30% (w/w) of an active compound selected from the group consisting of polyethylene wax, polyethylene, silicone, and mixtures thereof;
   40 to 90% (w/v) of a solvent selected from the group consisting of water, $C_2$-$C_{10}$ alcohol, and mixtures thereof;
   1 to 54% (w/v) of a surfactant;
   and optionally plasticizers;
   wherein the silicone is selected from the group consisting of poly [3-((2-aminoethyl) amino) propyl] methyl (dimethyl) siloxane, amino-modified polydimethylsiloxane, aminopropylaminoethylpolysiloxane, alkyl amino-functional polysiloxane, amino-functional polysiloxane, and mixtures thereof,
   wherein the surfactant comprises a non-ionic surfactant and a cationic surfactant, and
   wherein the composition comprises:
   1 to 30% (w/v) of the non-ionic surfactant, wherein the non-ionic surfactant is an ethoxylated $C_9$-$C_{11}$ alcohol; and
   1 to 24% (w/v) of the cationic surfactant, wherein the cationic surfactant is a quaternary $C_{12}$-$C_{14}$ alkyl methyl amine ethoxylate methyl chloride.

2. The composition according to claim 1, wherein the composition comprises:
   5 to 30% (w/w) of the active compound; and
   60 to 90% (w/v) of the solvent.

3. The composition according to claim 1, wherein the composition comprises:
   30 to 40% (w/v) of ethanol;
   50% (w/v) of water;
   10% (w/v) of amino-modified polydimethylsiloxane as active compound; or
   10% (w/v) of alkyl amino-functional polysiloxane as active compound.

4. The composition according to claim 1, wherein the $C_2$-$C_{10}$ alcohol is ethanol, propanol or mixtures thereof.

5. The composition according to claim 1, wherein the composition comprises 0.1 to 30% (w/v) of plasticizer.

6. The composition according to claim 1, wherein the solar panel is made of glass, metal, acrylic or combinations thereof.

7. The composition according to claim 1 wherein the solar panel is made of glass.

8. A method of applying the coating composition of claim 1, comprising applying the coating composition to a substrate, wherein the coating composition acts as a dirt-repellent agent, and as a hydrostatic and hydrophobic agent.

9. The method of claim 8, wherein the substrate is a solar panel or a solar cell, and wherein the coating composition acts as a yield enhancer of the solar panel or the solar cell.

10. An article that comprises the coating composition of claim 1, wherein the article is made of glass, metal, acrylic or combinations thereof.

11. The article of claim 10, wherein the article is a solar cell or a solar panel.

\* \* \* \* \*